United States Patent
Ko et al.

(10) Patent No.: US 11,072,530 B2
(45) Date of Patent: Jul. 27, 2021

(54) COMPOUND SEMICONDUCTOR AND USE THEREOF

(71) Applicant: LG CHEM, LTD., Seoul (KR)

(72) Inventors: Kyung Moon Ko, Daejeon (KR); Cheol Hee Park, Daejeon (KR); Chee Sung Park, Daejeon (KR); Min Kyoung Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 382 days.

(21) Appl. No.: 16/095,029

(22) PCT Filed: Dec. 22, 2017

(86) PCT No.: PCT/KR2017/015374
§ 371 (c)(1),
(2) Date: Oct. 19, 2018

(87) PCT Pub. No.: WO2018/124660
PCT Pub. Date: Jul. 5, 2018

(65) Prior Publication Data
US 2019/0144277 A1    May 16, 2019

(30) Foreign Application Priority Data

Dec. 28, 2016 (KR) .................. 10-2016-0181147
Dec. 21, 2017 (KR) .................. 10-2017-0177275

(51) Int. Cl.
*H01L 35/18* (2006.01)
*C01B 19/00* (2006.01)
(Continued)

(52) U.S. Cl.
CPC ........ *C01B 19/007* (2013.01); *H01L 31/0272* (2013.01); *H01L 31/0321* (2013.01); *H01L 31/04* (2013.01); *H01L 31/18* (2013.01); *H01L 35/14* (2013.01); *H01L 35/18* (2013.01); *H01L 35/34* (2013.01); *H01L 49/00* (2013.01);
(Continued)

(58) Field of Classification Search
CPC ......... H01L 35/12; H01L 35/16; H01L 35/18; H01L 31/02725; H01L 31/0272; C01B 19/007
See application file for complete search history.

(56) References Cited

U.S. PATENT DOCUMENTS 6,207,888 B1   3/2001 Nolas
6,369,314 B1   4/2002 Nolas
(Continued)

FOREIGN PATENT DOCUMENTS

CN   106025056 A   10/2016
EP   3203535 A1   8/2017
(Continued)

OTHER PUBLICATIONS

Scherrer. Solar thermolectric generator based on skutterudites. Journal of Power Sources 115 (2003) 141-148 (Year: 2003).*
(Continued)

*Primary Examiner* — Matthew E. Hoban
(74) *Attorney, Agent, or Firm* — Birch, Stewart, Kolasch & Birch, LLP.

(57) ABSTRACT

A novel compound semiconductor which can be used for a solar cell, a thermoelectric material, or the like, and the use thereof.

13 Claims, 2 Drawing Sheets

(51) Int. Cl.
*H01L 49/00* (2006.01)
*H01L 31/18* (2006.01)
*H01L 35/34* (2006.01)
*H01L 31/04* (2014.01)
*H01L 31/0272* (2006.01)
*H01L 31/032* (2006.01)
*H01L 35/14* (2006.01)

(52) U.S. Cl.
CPC ...... *C01P 2002/52* (2013.01); *C01P 2002/77* (2013.01); *C01P 2006/32* (2013.01); *C01P 2006/40* (2013.01); *Y02E 10/50* (2013.01); *Y02P 70/50* (2015.11)

(56) References Cited

U.S. PATENT DOCUMENTS

| | | |
|---|---|---|
| 2006/0016470 A1 | 1/2006 | Yang et al. |
| 2010/0155675 A1 | 6/2010 | Yang et al. |
| 2010/0294326 A1 | 11/2010 | Guo et al. |
| 2013/0009113 A1 | 1/2013 | Park et al. |
| 2016/0204327 A1 | 7/2016 | Kwon et al. |
| 2016/0276564 A1 | 9/2016 | Nie et al. |

FOREIGN PATENT DOCUMENTS

| | | |
|---|---|---|
| JP | 2001-196647 A | 7/2001 |
| JP | 2014-522562 A | 9/2014 |
| JP | 2016-178176 A | 10/2016 |
| KR | 10-2009-0026665 A | 3/2009 |
| KR | 10-2009-0026667 A | 3/2009 |
| KR | 10-0910158 B1 | 7/2009 |
| KR | 20090026667 * | 7/2009 |
| KR | 10-2012-0070124 A | 6/2012 |
| KR | 10-1179010 B1 | 8/2012 |
| KR | 10-2015-0040240 A | 4/2015 |
| WO | WO 2009/093455 A1 | 7/2009 |
| WO | WO 2012/157904 A1 | 11/2012 |
| WO | WO 2016/052948 A1 | 4/2016 |

OTHER PUBLICATIONS

Machine translation of KR20090026667A. Retrieved from google patents: https://patents.google.com/patent/KR20090026667A/en?oq=KR20090026667 on Dec. 30, 2020 (Year: 2009).*
Duan. Electronegative guests in CoSb3. Energy Environ. Sci., 2016, 9, 2090-2098 (Year: 2016).*
Duan et al., "Beneficial effect of Se substitution on thermoelectric properties in $Co_4Sb_{12-x-y}Te_xSe$ skutterudites", AIP Conf. Proc. 1449, 2012, pp. 239-242.
Duan et al., "Electronegative guests in $CoSb_3$", Energy & Environmental Science, 2016, vol. 9, No. 6, pp. 2090-2098.
Duan et al., "Enhanced thermoelectric performance in sulfur-doped $Co_4Sb_{11.3-x}Te_xS_{03}$ skutterudites", Materials Letters 2012. vol. 79, pp. 69-71.
Duan et al., "Thermoelectric performance of tellurium and sulfur double-substituted skutterudite materials", J Mater Sci 2014, vol. 49, pp. 4445-4452.
International Search Report (PCT/ISA/210) issued in PCT/KR2017/015374, dated Apr. 5, 2018.
Wojciechowski et al., "Thermoelectric properties and electronic structure of $CoSb_3$ doped with Se and Te", Journal of Alloys and Compounds 2003, vol. 361, pp. 19-27.
Extended European Search Report, dated May 15, 2019, for European Application No. 17886732.1.
Nolas et al., "Thermoelectric Properties of Sn-filled Skutterudites," Applied Physics Letters, vol. 77, No. 1, Jul. 3, 2000, pp. 52-54.

* cited by examiner

[FIG.1]
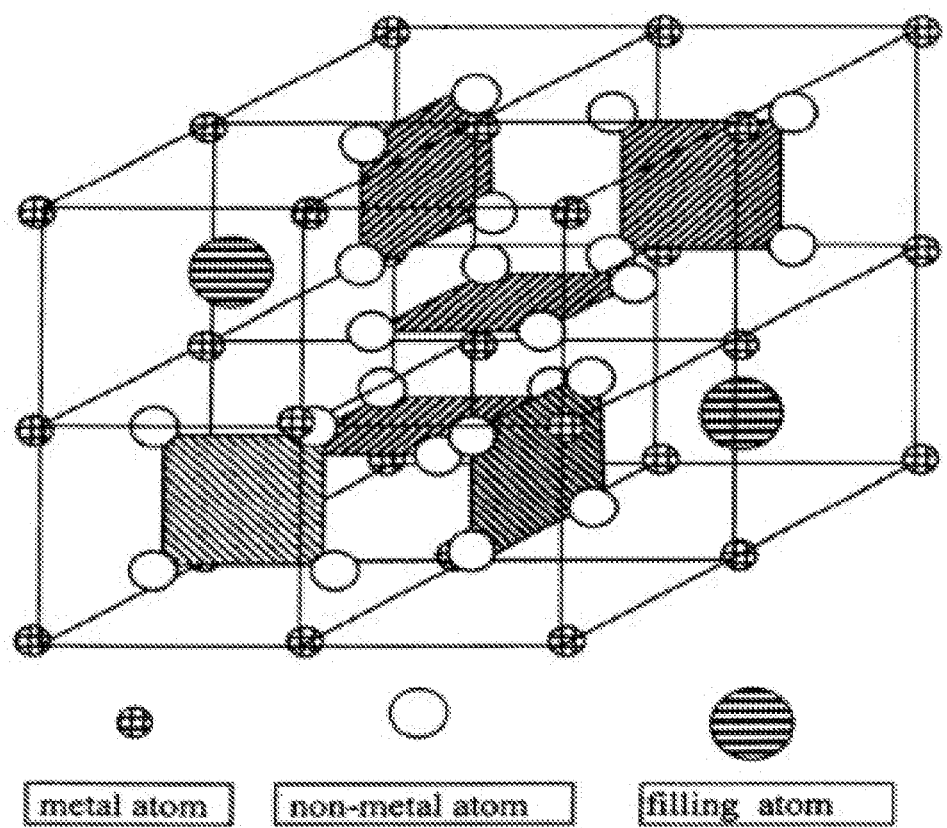

[FIG.2]
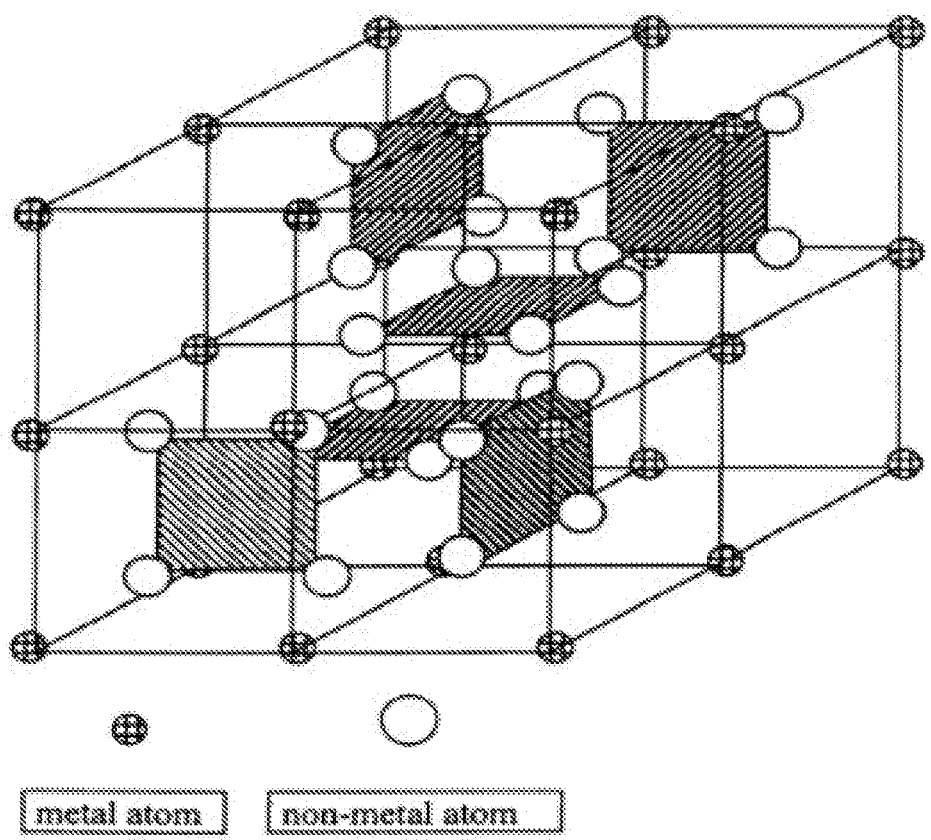

COMPOUND SEMICONDUCTOR AND USE THEREOF

CROSS-REFERENCE TO RELATED APPLICATION(S)

This application claims the benefit of priority from Korean Patent Application No. 10-2016-0181147 filed on Dec. 28, 2016 and Korean Patent Application No. 10-2017-0177275 filed on Dec. 21, 2017 with the Korean Intellectual Property Office, the full disclosures of which are incorporated herein by reference in their entirety.

TECHNICAL FIELD

The present invention relates to a novel compound semiconductor material which can be used for a solar cell, a thermoelectric material, or the like, a method for preparing the same, and the use thereof.

BACKGROUND ART

A compound semiconductor is not a single element such as silicon or germanium, but is a compound composed of two or more types of elements, and operates as a semiconductor. Various types of these compound semiconductors have been developed and are currently used in various fields of industry. Typically, a compound semiconductor may be used for thermoelectric conversion devices using the Peltier effect, light emitting devices such as light emitting diodes or laser diodes using a photoelectric conversion effect, solar cells, and the like.

Among these, the thermoelectric conversion device may be applied to thermoelectric conversion generation, thermoelectric conversion cooling, or the like. Here, in the thermoelectric conversion generation, a thermal electromotive force generated as a result of a temperature difference in the thermoelectric conversion device is used for converting thermal energy to electrical energy.

The energy conversion efficiency of the thermoelectric conversion device depends on ZT, which is a performance index value of thermoelectric conversion materials. Here, the ZT is determined based on the Seebeck coefficient, electrical conductivity, thermal conductivity, or the like. More specifically, ZT is proportional to the square of the Seebeck coefficient and the electric conductivity, and is inversely proportional to the thermal conductivity. Therefore, in order to enhance the energy conversion efficiency of the thermoelectric conversion device, development of a thermoelectric conversion material having a high Seebeck coefficient, high electrical conductivity, or low thermal conductivity is required.

Meanwhile, solar cells are environment-friendly since they do not require a separate energy source other than solar rays existing in nature, and therefore are actively studied as an alternative future energy source. A solar cell may be generally classified into a silicon solar cell using a single element of silicon, a compound semiconductor solar cell using a compound semiconductor, and a tandem solar cell in which at least two solar cells having different band gap energies are laminated.

Among these, the compound semiconductor solar cell uses a compound semiconductor in a light-absorbing layer, which absorbs solar rays and generates an electron-hole pair, and particularly, it may use compound semiconductors in Group V such as GaAs, InP, GaAlAs, GaInAs, or the like, compound semiconductors in Group VI such as CdS, CdTe, ZnS, or the like, or compound semiconductors in Group III, typically $CuInSe_2$ or the like.

The light-absorbing layer of the solar cell requires excellent long-term electrical and optical stability, high photoelectric conversion efficiency, and easy control of the band gap energy or conductivity by composition change or doping. In addition, conditions such as production cost and yield should also be met for practical use. However, many conventional compound semiconductors fail to meet all of these conditions at once.

DETAILED DESCRIPTION OF THE INVENTION

Technical Problem

The present invention has been designed to overcome the problems of the prior art, and therefore it is an object of the present invention to provide a novel compound semiconductor material which may be utilized in various ways for a thermoelectric conversion material of a thermoelectric conversion device, a solar cell, or the like, a preparation method thereof, and a thermoelectric conversion device or solar cell using the same.

Other objects and advantages of the present invention will be understood from the description below and will become more fully apparent by the embodiments of the present invention. In addition, it will be readily understood that the objects and advantages of the present invention may be realized by the means defined in the appended claims and combinations thereof.

Technical Solution

After repeated studies on the compound semiconductors in order to achieve the above objects, the present inventors have successfully synthesized a compound semiconductor represented by Chemical Formula 1 below, including: a Co—SB skutterudite compound; Sn and S that are included in internal voids of the Co—SB skutterudite compound; and Q that is substituted with Sb of the Co—SB skutterudite compound, and found that this compound can be used for a thermoelectric conversion material of a thermoelectric conversion device, a light-absorbing layer of a solar cell, or the like, thereby completing the present invention.

Hereinafter, preferred embodiments of the present invention will be described in detail. Prior to the description, it will be understood that words or terms used in the specification and the appended claims shall not be interpreted as limited to the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

Therefore, the constitution illustrated herein is merely a preferable embodiment and does not represent all the technical ideas of the present invention, thus, it should be understood that other equivalents and modifications at the time of present application could be made thereto without departing from the spirit and scope of the disclosure.

The present invention provides a novel compound semiconductor represented by the following Chemical Formula 1, including: a Co—SB skutterudite compound; Sn and S that are included in internal voids of the Co—SB skutterudite compound; and Q that is substituted with Sb of the Co—SB skutterudite compound.

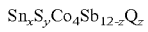
 [Chemical Formula 1]

In Chemical Formula 1, Q is at least one element selected from the group consisting of O, Se, and Te, wherein 0<x<0.2, 0<y≤1, and 0<z<12. The at least one element selected from the group consisting of O, Se, and Te may refer to O, Se, or Te alone, or a mixture of two or more thereof.

In Chemical Formula 1, Sn is an element symbol representing a tin element, S is an element symbol representing a sulfur element, Co is an element symbol representing a cobalt element, Sb is an element symbol representing an antimony element, and Q is used to replace at least one element selected from the group consisting of oxygen, selenium, and tellurium.

In addition, in Chemical Formula 1, x means a relative molar ratio of the tin element, y means a relative molar ratio of the sulfur element, and z means a relative molar ratio of at least one element selected from the group consisting of oxygen, selenium, and tellurium.

Preferably, in Chemical Formula 1, Q may be Se or Te.

More preferably, in Chemical Formula 1, Q may be Te.

By substituting Q at a Sb site of Chemical Formula 1, the carrier concentration is increased, thereby enhancing the electrical characteristics of the compound semiconductor of Chemical Formula 1.

In addition, preferably, in Chemical Formula 1, x may be in the range of 0.01≤x≤0.18.

More preferably, in Chemical Formula 1, x may be in the range of 0.05≤x≤0.15.

In Chemical Formula 1, when x is increased to 0.2 or more, Sn and S form a secondary phase such as SnS without being located in internal voids of the Co—SB lattice. Therefore, as the thermal conductivity of the compound semiconductor of Chemical Formula 1 is rapidly increased, the thermoelectric performance may be lowered.

Further, preferably, in Chemical Formula 1, y may be in the range of 0<y≤0.5.

The present inventors conducted studies on an N-type skutterudite thermoelectric material having excellent thermoelectric performance, and found through experiments that when a Co—SB skutterudite compound is multiply filled with Sn and S elements as fillers and doped with a specific charge compensator at Sb sites, the lattice thermal conductivity is lowered and the output factor is increased, thereby exhibiting high thermoelectric conversion efficiency. The present invention has been completed on the basis of such findings.

The skutterudite compound may have a unit lattice structure as shown in FIG. 2. Specifically, in the unit lattice, it may contain 6 cube structures in which metal atoms are located at eight vertices and four non-metallic atoms form a planar structure therein, and may contain two cube structures in which metal atoms are located at eight vertices and whose interior is empty.

In the present invention, Sn and S elements are filled into the voids included in the unit lattice of the Co—Sb skutterudite compound as a filler as shown in FIG. 1 to induce a rattling effect, thereby reducing the lattice thermal conductivity, and additional electrons can be supplied via Sn, and the concentration of the charge carrier can be adjusted to the optimum level through the chemical properties for supplying holes via S. Thus, the N-type skutterudite thermoelectric material having reduced lattice thermal conductivity and an improved output factor can exhibit more improved thermoelectric properties. In the compound semiconductor, the Co—Sb skutterudite compound may comprise two voids per unit lattice.

In addition, in the Co—SB skutterudite compound, at least one element selected from the group consisting of O, Se, and Te may be substituted (doped) at Sb sites, and the doping amount z of the element substituted (doped) at Sb sites has a value in the range of 0<z<12. In particular, when the doping amount of z exceeds 0.2, the thermoelectric properties may be deteriorated by the formation of a secondary phase, and thus it is preferable to have a value in the range of 0<z≤0.2.

The N-type skutterudite thermoelectric material in which a specific charge compensator is substituted (doped) at Sb sites as described above can control and thus optimize the concentration of the charge carrier and can reduce the lattice thermal conductivity to have a higher thermoelectric performance index ZT value.

In particular, it is preferable to use Te or Se as the charge compensator to be substituted (doped) at Sb sites. This is because, in case of Te or Se in the N-type skutterudite thermoelectric material, there are specific differences depending on the degree of ionization of each atom, but the concentration of electrons provided therefrom is sufficiently high and so additional electrons can be provided, thereby controlling and optimizing the concentration of the charge carrier.

On the other hand, when Sn is used as the charge compensator substituted (doped) at Sb sites, the concentration of electrons provided from Sn is low and so additional holes are provided, which is suitable for a P-type skutterudite thermoelectric material, and there is a limitation in that it is difficult to be used as an N-type thermoelectric material.

That is, the compound semiconductor of one embodiment may include: a Co—SB skutterudite compound; Sn and S that are included in internal voids of the Co—SB skutterudite compound; and Q that is substituted with Sb of the Co—SB skutterudite compound. Further, the compound semiconductor of one embodiment may be used as an N-type compound semiconductor.

Meanwhile, as the compound semiconductor of Chemical Formula 1 includes both Sn and S, it has high stability against oxidation even at high temperatures and thus can improve durability in a thermoelectric module while minimizing the process cost, and also, it can remarkably reduce the thermal conductivity of the compound semiconductor of Chemical Formula 1, thereby realizing improved thermoelectric performance.

Herein, in Chemical Formula 1, the molar ratio of x to 1 mol of y may be 0.1 mol to 0.9 mol, 0.2 mol to 0.8 mol, or 0.25 mol to 0.75 mol. When the mole ratio of x to 1 mol of y in Chemical Formula 1 is increased to more, than 0.9, the thermoelectric performance ma decrease as the thermal conductivity of the compound semiconductor of the Chemical Formula 1 increases rapidly. Farther, when the molar ratio of x to 1 mol of y in Chemical Formula 1 is reduced to less than 0.1, the content of Sn in the compound semiconductor of Chemical Formula 1 is insufficient and thus it may be difficult to sufficiently realize the effects resulting from the addition of Sn. Also, in Chemical Formula 1, the molar ratio of x to 1 mol of z may be 0.01 mol to 0.5 mol, or the molar ratio of x to 1 mol of z is 0.05 mol to 0.3 mol.

Preferably, in Chemical Formula 1, z is in the range of 0<z≤4.

More preferably, in Chemical Formula 1, z may be in the range of 0<z≤0.25.

Most preferably, in Chemical Formula 1, z may be in the range of 0<z≤1.5.

Meanwhile, the compound semiconductor represented by Chemical Formula 1 may include a part of the secondary phase, and the amount thereof may vary depending on the thermal treatment conditions.

The compound semiconductor according to the present invention may be prepared by a method including the steps of forming a mixture containing Sn, S, Co, Sb, and at least one element selected from the group consisting of O, Se, Te and thermally treating the mixture. The at least one element selected from the group consisting of O, Se, and Te may refer to O, Se, or Te, alone or a mixture of two or more thereof.

Meanwhile, each raw material mixed in the mixture forming step may be in a powder form, but the present invention is not limited to a specific form of the mixing material.

Further, preferably, the thermal treatment step may be performed in vacuum, or it may be performed while flowing a gas such as Ar, He, and $N_2$, partially containing hydrogen or not containing hydrogen.

At this time, the temperature for thermal treatment may be 400° C. to 800° C. Preferably, the temperature for thermal treatment may be 450° C. to 700° C. More preferably, the temperature for thermal treatment may be 500° C. to 700° C.

Meanwhile, the thermal treatment step may include two or more thermal treatment steps. For example, the mixture formed in the mixture forming step, namely in the step of mixing raw materials, may be subjected to a first thermal treatment at a first temperature, and then subjected to a second thermal treatment at a second temperature.

In this case, some thermal treatment steps among the plurality of thermal treatment steps may be performed in the mixture forming step of mixing the raw materials.

For example, the thermal treatment step may include three thermal treatment steps composed of a first thermal treatment step, a second thermal treatment step, and a third thermal treatment step. In addition, the first thermal treatment step may be performed in a temperature range of 400° C. to 600° C., and the second and third thermal treatment steps may be performed in a temperature range of 600° C. to 800° C. At this time, the first thermal treatment step may be performed during the mixture forming step, and the second and third thermal treatment steps may be performed sequentially after the mixture forming step.

After the thermal treatment step, it may include a step of cooling the thermally-treated mixture. The cooling step is performed so as to bring the temperature of the thermally-treated mixture to room temperature (about 20° C. to 30° C.), and various cooling methods or cooling devices known in the art may be used without limitation.

Meanwhile, a pressure-sintering step may be additionally performed on the thermally-treated mixture or cooled mixture after the thermal treatment, if necessary. Specific examples of the method for proceeding the pressure sintering step are not particularly limited, but it may be preferably performed by means of hot pressing (HP) or spark plasma sintering (SPS). Specifically, the pressure sintering step may be performed at a temperature of 500° C. to 700° C. under a pressure of 20 MPa to 50 MPa for 10 minutes to 60 minutes.

If the sintering temperature is less than 500° C., or the sintering time and pressure are low, a high-density sintered body cannot be obtained. Also, a high pressure is undesirable because it can lead to the risk of damage to applied molds and equipment.

In particular, spark plasma sintering (SPS) may preferably be used. Spark plasma sintering (SPS) is a method for sintering a powder or plate by applying a pulsed direct current in a direction parallel to the pressing direction while pressing the powder or sheet in one axis, which is a sintering method in which pressure, low voltage, and high current are applied to a powder or plate and the high energy of the plasma generated instantaneously by the spark generated at this time is applied to electric field diffusion, thermal diffusion, or the like. Such spark plasma sintering is performed at a lower sintering temperature than that of conventional hot pressing, and sintering can be completed within a short period of time including the time for temperature rise and retention. Therefore, the power consumption is greatly reduced, handling is convenient, and operation cost is low. In addition, it has advantages in that it does not require skills in sintering techniques and that it can be applied to materials that are difficult to sinter and process at high temperatures.

Before performing the pressure sintering step, it may further include a step of pulverizing the thermally-treated mixture, or optionally a mixture cooled after the thermal treatment. Examples of the pulverizing method are not particularly limited, and various pulverizing methods or pulverizing apparatuses known in the art may be applied without limitation.

The thermoelectric conversion device according to the present invention may include the compound semiconductor described above. In other words, the compound semiconductor according to the present invention may be used as a thermoelectric conversion material for the thermoelectric conversion device. In particular, in the compound semiconductor according to the present invention, ZT, which is a performance index of the thermoelectric conversion material, is large. In addition, the compound semiconductor has excellent thermoelectric conversion performance because it has a high Seebeck coefficient and electric conductivity, and low thermal conductivity. Therefore, the compound semiconductor according to the present invention may replace a conventional thermoelectric conversion material or may be used for a thermoelectric conversion device in addition to the conventional compound semiconductor.

Moreover, the solar cell according to the present invention may include the compound semiconductor described above. In other words, the compound semiconductor according to the present invention may be used for a solar cell, particularly a light-absorbing layer of a solar cell.

The solar cell may be prepared with a structure in which a front transparent electrode, a buffer layer, a light-absorbing layer, a back electrode, and a substrate are laminated in order from the side where solar rays are incident. The substrate located at the lowest part may be made of glass, and the back electrode formed thereon may be formed by depositing a metal such as Mo or the like.

Subsequently, the compound semiconductor according to the present invention may be laminated on the upper part of the back electrode by means of an electron beam deposition method, a sol-gel method, PLD (Pulsed Laser Deposition), or the like to form the light-absorbing layer. On the upper part of the light-absorbing layer, a buffer layer for buffering the difference in a lattice constant and a band gap between a ZnO layer used as the front transparent electrode and the light-absorbing layer may be present. Such buffer layer may be formed by depositing a material such as CdS by a method such as CBD (Chemical Bath Deposition). Next, the front transparent electrode may be formed as a ZnO or ZnO and ITO laminated film on the buffer layer by a method such as sputtering.

The solar cell according to the present invention may be modified in various ways. For example, it is possible to manufacture a tandem solar cell, in which a solar cell using the compound semiconductor according to the present invention as a light-absorbing layer is laminated. In addition, other solar cells laminated as described above may employ a solar cell using silicon or another known compound semiconductor.

In addition, a plurality of solar cells which use compound semiconductors having different band gaps as light-absorbing layers may be laminated by changing the band gap of the compound semiconductor according to the present invention. The band gap of the compound semiconductor according to the present invention may be adjusted by changing a composition ratio of an element constituting the compound, particularly Te.

Further, the compound semiconductor according to the present invention may also be applied to IR windows or IR sensors which selectively pass IR.

Advantageous Effect

According to the present invention, a novel compound semiconductor material is provided. According to one aspect of the present invention, the novel compound semiconductor may replace a conventional compound semiconductor or may be used as another material in addition to the conventional compound semiconductor.

According to one aspect of the present invention, because the compound semiconductor has good thermoelectric conversion performance, it may be appropriately used for a thermoelectric conversion device. In particular, the compound semiconductor according to the present invention may be used as a thermoelectric conversion material of a thermoelectric conversion device.

In addition, according to another aspect of the present invention, the compound semiconductor may be used for a solar cell. In particular, the compound semiconductor of the present invention may be used as a light-absorbing layer of a solar cell.

Moreover, according to still another aspect of the present invention, the compound semiconductor may be used for IR windows or IR sensors which selectively pass IR, a magnetic device, a memory, or the like.

BRIEF DESCRIPTION OF THE DRAWINGS

FIG. 1 illustrates the unit lattice of the compound of Example 1.

FIG. 2 illustrates the unit lattice of the skutterudite compound.

DETAILED DESCRIPTION OF THE EMBODIMENTS

The present invention will be described in more detail by way of examples. However, these examples are given for illustrative purposes only, and the scope of the invention is not intended to be limited by these examples EXAMPLES 1 to 3

Preparation of Compound Semiconductors

Example 1

A $Co_4Sb_{12}$ skutterudite compound; and $Sn_{0.05}S_{0.2}Co_4Sb_{11.4}Te_{0.6}$ in which Sn and S were filled into internal voids of the $Co_4Sb_{12}$ skutterudite compound and Te was doped at a Sb site of the $Co_4Sb_{12}$ skutterudite compound, were synthesized by the following method.

Sn, S, Co, Sb, and Te in a powder form were weighed, and then they were put into an alumina mortar, following by mixing. The mixed materials were put into a hard mold, formed into pellets, put into a fused silica tube, and vacuum-sealed. Then, the resultant product was put into a box furnace and heated at 680° C. for 15 hours, and then slowly cooled down to room temperature to synthesize $Sn_{0.05}S_{0.2}Co_4Sb_{11.4}Te_{0.6}$.

Next, the synthesized compound was filled into a graphite mold for spark plasma sintering, and then subjected to spark plasma sintering at a temperature of 650° C. under a pressure of 50 MPa for 10 minutes to prepare the compound semiconductor of Example 1. At this time, the relative density of the compound semiconductor was measured to be 98% or more.

Example 2

A compound semiconductor was prepared in the same manner as in Example 1, except that the mixture composition was changed to $Sn_{0.1}S_{0.2}Co_4Sb_{11.4}Te_{0.6}$.

Example 3

A compound semiconductor was prepared in the same manner as in Example 1, except that the mixture composition was changed to $Sn_{0.15}S_{0.2}Co_4Sb_{11.4}Te_{0.6}$.

COMPARATIVE EXAMPLES 1 TO 3

Preparation of Compound Semiconductors

Comparative Example 1

A compound semiconductor was prepared in the same manner as in Example 1, except that S, Co, Sb, and Te were prepared as reagents, and the mixture composition was changed to $S_{0.2}Co_4Sb_{11.4}Te_{0.6}$.

Comparative Example 2

A compound semiconductor was prepared in the same manner as in Example 1, except that Sn, Co, Sb, and Te were prepared as reagents, and the mixture composition was changed to $Sn_{0.05}Co_4Sb_{11.4}Te_{0.6}$.

Comparative Example 3

A compound semiconductor was prepared in the same manner as in Example 1, except that the mixture composition was changed to $Sn_{0.2}S_{0.2}Co_4Sb_{11.4}Te_{0.6}$.

Experimental Examples

Measurement of Physical Properties of Compound Semiconductors Obtained in Examples and Comparative Examples The physical properties of the compound semiconductors obtained in the examples and comparative examples were measured by the following methods, and the results are shown in Tables 1 and 2 below.

1. Lattice Thermal Conductivity (W/mK)

The compound semiconductors obtained in the examples and comparative examples were processed into a coin-type having a diameter of 12.7 mm and a height of 1.5 mm to prepare a specimen. Then, the thermal conductivity of the specimen was calculated from the measured values of thermal diffusivity, specific heat, and density by means of a laser flash (Netzsch, LFA-457) in the range of 50° C. to 500° C. Then, the Lorenz number was calculated and the value thereof was applied to the calculated thermal conductivity to obtain lattice thermal conductivity. The results are shown in Table 1 below.

TABLE 1

Lattice thermal conductivity of compound semiconductors of examples and comparative examples

| Category | Temperature (° C.) | Lattice thermal conductivity (W/mK) |
|---|---|---|
| Example 1 | 50 | 2.00 |
|  | 100 | 1.86 |
|  | 200 | 1.65 |
|  | 300 | 1.49 |
|  | 400 | 1.38 |
|  | 500 | 1.30 |
| Example 2 | 50 | 1.90 |
|  | 100 | 1.78 |
|  | 200 | 1.58 |
|  | 300 | 1.43 |
|  | 400 | 1.33 |
|  | 500 | 1.27 |
| Example 3 | 50 | 1.93 |
|  | 100 | 1.80 |
|  | 200 | 1.59 |
|  | 300 | 1.44 |
|  | 400 | 1.35 |
|  | 500 | 1.30 |
| Comparative Example 1 | 50 | 2.19 |
|  | 100 | 2.04 |
|  | 200 | 1.80 |
|  | 300 | 1.62 |
|  | 400 | 1.51 |
|  | 500 | 1.44 |
| Comparative Example 2 | 50 | 3.27 |
|  | 100 | 3.00 |
|  | 200 | 2.56 |
|  | 300 | 2.23 |
|  | 400 | 1.99 |
|  | 500 | 1.85 |
| Comparative Example 3 | 50 | 2.29 |
|  | 100 | 2.14 |
|  | 200 | 1.92 |
|  | 300 | 1.78 |
|  | 400 | 1.71 |
|  | 500 | 1.70 |

As shown in Table 1, it was confirmed that in the case of the compound semiconductors of Examples 1 to 3, as Sn and S were filled simultaneously, the lattice thermal conductivity was lowered over the entire temperature measurement section as compared with those of Comparative Examples 1 and 2.

In addition, when Sn was excessively filled as in Comparative Example 3, it was confirmed that since Sn and S formed a secondary phase such as SnS without being located in internal voids of the Co—SB lattice, the lattice thermal conductivity was increased as compared with those of the examples.

2. Thermoelectric Performance Index (ZT)

The compound semiconductors obtained in the examples and comparative examples were processed into a rectangular-type having a length of 3 mm, a width of 3 mm, and a height of 12 mm to prepare a specimen. Then, the electrical conductivity and the Seebeck coefficient of the specimen were measured using ZEM-3 (Ulvac-Rico, Inc.) in the range of 50° C. to 500° C.

Next, the thermoelectric performance index (ZT) was calculated from the measured electrical conductivity, Seebeck coefficient, and thermal conductivity value of Experimental Example 1 described above by using the mathematical equation below, and the results are shown in Table 2 below.

$$ZT = \sigma S^2 T / \kappa \quad \text{[Mathematical Equation]}$$

Herein, ZT represents a thermoelectric performance index, σ represents electrical conductivity, S represents a Seebeck coefficient, T represents temperature, and κ represents thermal conductivity.

TABLE 2

Thermoelectric performance index of the compound semiconductors of examples and comparative examples

| Category | Temperature (° C.) | Thermoelectric performance index |
|---|---|---|
| Example 1 | 50 | 0.26 |
|  | 100 | 0.35 |
|  | 200 | 0.57 |
|  | 300 | 0.81 |
|  | 400 | 1.04 |
|  | 500 | 1.24 |
| Example 2 | 50 | 0.27 |
|  | 100 | 0.36 |
|  | 200 | 0.58 |
|  | 300 | 0.82 |
|  | 400 | 1.05 |
|  | 500 | 1.26 |
| Example 3 | 50 | 0.28 |
|  | 100 | 0.37 |
|  | 200 | 0.60 |
|  | 300 | 0.84 |
|  | 400 | 1.08 |
|  | 500 | 1.28 |
| Comparative Example 1 | 50 | 0.25 |
|  | 100 | 0.34 |
|  | 200 | 0.54 |
|  | 300 | 0.76 |
|  | 400 | 0.98 |
|  | 500 | 1.18 |
| Comparative Example 2 | 50 | 0.19 |
|  | 100 | 0.26 |
|  | 200 | 0.43 |
|  | 300 | 0.61 |
|  | 400 | 0.81 |
|  | 500 | 0.99 |
| Comparative Example 3 | 50 | 0.23 |
|  | 100 | 0.31 |
|  | 200 | 0.50 |
|  | 300 | 0.70 |
|  | 400 | 0.88 |
|  | 500 | 1.03 |

As shown in Table 2, it was confirmed that in the case of the compound semiconductors of Examples 1 to 3, as Sn and S were filled simultaneously, the thermoelectric performance index was enhanced over the entire temperature measurement section as compared with those of Comparative Examples 1 and 2.

In addition, when Sn was excessively filled as in Comparative Example 3, it was confirmed that it could not be used as a thermoelectric material because the thermoelectric performance index was significantly lowered as compared with those of the examples.

The invention claimed is:

1. A compound semiconductor represented by the following Chemical Formula 1, comprising: a Co—Sb skutterudite compound; Sn and S that are included in internal voids of the Co—Sb skutterudite compound; and Q that is substituted with Sb of the Co—Sb skutterudite compound:

$$Sn_xS_yCo_4Sb_{12-z}Q_z \quad \text{[Chemical Formula 1]}$$

wherein, in Chemical Formula 1, Q is at least one selected from the group consisting of O, Se, and Te, wherein $0<x<0.2$, $0<y\leq1$, and $0<z<12$, and the molar ratio of x to 1 mol of y is 0.1 mol to 0.9 mol.

2. The compound semiconductor of claim 1, wherein in Chemical Formula 1, the molar ratio of x to 1 mol of y is 0.2 mol to 0.8 mol.

3. The compound semiconductor of claim 1, wherein in Chemical Formula 1, z is in the range of $0<z\leq4$.

4. The compound semiconductor of claim 1, wherein in Chemical Formula 1, the molar ratio of x to 1 mol of z is 0.01 mol to 0.5 mol.

5. The compound semiconductor of claim 1, wherein in Chemical Formula 1, the molar ratio of x to 1 mol of z is 0.05 mol to 0.3 mol.

6. The compound semiconductor of claim 1, wherein the Co—Sb skutterudite compound comprises two voids per unit lattice.

7. The compound semiconductor of claim 1, wherein the compound semiconductor is an N-type compound semiconductor.

8. A method for preparing the compound semiconductor of claim 1 comprising the steps of:
forming a mixture containing Sn, S, Co, Sb, and at least one element selected from the group consisting of O, Se and Te; and
thermally treating the mixture.

9. The method for preparing the compound semiconductor of claim 8, wherein the thermal treatment step is performed at 400° C. to 800° C.

10. The method for preparing the compound semiconductor of claim 8, wherein the thermal treatment step comprises two or more thermal treatment steps.

11. The method for preparing the compound semiconductor of claim 8, further comprising a pressure-sintering step after thermally treating the mixture.

12. A thermoelectric conversion device comprising the compound semiconductor according to claim 1.

13. A solar cell comprising the compound semiconductor according to claim 1.

* * * * *